United States Patent
Ihm

(12) 
(10) Patent No.: US 6,232,811 B1
(45) Date of Patent: May 15, 2001

(54) CIRCUIT FOR CONTROLLING SETUP/HOLD TIME OF SEMICONDUCTOR DEVICE

(75) Inventor: Jeong Don Ihm, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/476,212

(22) Filed: Dec. 30, 1999

(30) Foreign Application Priority Data

Dec. 31, 1998 (KR) .................................. 98-62893

(51) Int. Cl.$^7$ ...................................... H03H 11/26
(52) U.S. Cl. ......................... 327/262; 327/270; 327/376
(58) Field of Search .................... 327/262, 270, 327/271, 272, 274, 276, 277, 278, 280, 281, 284, 285, 287, 288, 393, 394, 395, 396, 400

(56) References Cited

U.S. PATENT DOCUMENTS 4,256,974  3/1981  Padgett et al. ...................... 307/475
6,127,869  * 10/2000  Hirasaka .............................. 327/262

* cited by examiner

*Primary Examiner*—Toan Tran
*Assistant Examiner*—Linh Nguyen
(74) *Attorney, Agent, or Firm*—Morgan, Lewis & Bockius LLP

(57) ABSTRACT

There is provided a circuit for controlling the setup/hold time of a semiconductor device, including: a setup/hold on signal generator for generating a setup/hold on signal of the semiconductor device; a comparison signal generator for converting the difference between pulse widths of the setup on signal and hold on signal of the setup/hold on signal generator into the voltage difference across an inner capacitor, to generate a comparison signal for the setup/hold time; a comparison signal detector for detecting the comparison signal generated by the comparison signal generator and amplifying it to a predetermined level; a clock delay path selection signal generator for generating a clock delay path selection signal according to the level of the signal detected by the comparison signal detector; and a clock/command signal processor for outputting a clock signal and command signal applied to input pads as an inner clock signal and inner command signal whose delays are compensated according to the clock delay path selection signal, to thereby sufficiently secure the margin of the setup/hold time.

12 Claims, 6 Drawing Sheets

CIRCUIT FOR CONTROLLING SETUP/HOLD TIME OF SEMICONDUCTOR DEVICE

BACKGROUND OF THE INVENTION

1. Field of the Invention

The present invention relates to a semiconductor device, specifically, to a circuit for controlling the setup/hold time of a semiconductor device, which sufficiently secures the margin of setup/hold time in clock latching operation.

2. Discussion of Related Art

When a clock is changed from a low level to a high level in a semiconductor device, the left side of the point of time when the clock is changed is generally called a setup time and its right side is called a hold time. A delay occurs in the reference clock being inputted to the semiconductor device due to various external causes, generating an internal clock K_int. The margin of one of the setup time and hold time is biased according to an input signal having a delay on the basis of the internal clock, decreasing the margin of one of the setup time and hold time.

A conventional semiconductor device control signal input circuit is explained below with reference to the attached drawings. FIG. 1 shows the configuration of the conventional semiconductor device control signal input circuit, and FIG. 2 shows the operation waveforms of the circuit of FIG. 1. The control signal input circuit includes a plurality of input pads through which an external clock signal clock_pad and external command signal command_pad are supplied into a semiconductor device, and a plurality of buffers for generating an inner clock signal clock_i and inner command signal command_i according to the external clock signal_pad and external command signal command_pad. Each of the buffers consists of four-stage buffers having different capacities. Here, the final-stage buffer a4 is configured of a buffer having a large driving power because the inner clock signal is used in the semiconductor device most frequently so that intensive load is applied to the buffers. The first buffers a1, a2, a3 and a4, serially connected, generate the inner clock signal, and second buffers b1, b2, b3 and b4, serially connected, generate the inner command signal.

As shown in FIG. 1, the buffers generating the inner command signal are configured of buffers having medium capacities because they do not require large capacity compared to the buffers generating the inner clock signal. The delay times of buffers connected to the clock signal input pad and command signal input pad are synchronized with each other, and the phase difference between the inner clock signal clock_i and inner command signal command_i is set to 180°, thereby making the periods of setup time and hold time symmetrical to each other. In the conventional control signal input circuit constructed as above, clock signal clock_pad and command signal command_pad are applied to the input pads, and pass through buffering process, to be used inside the semiconductor device.

After passing through the buffers, clock signal clock_pad and command signal command_pad pass through a clock buffer delay and command buffer delay, respectively, to be converted into the inner clock signal clock_i and inner command signal command_i. If the buffer delays are identically designed in the normal state to allow the input signal to have the phase of 180°, the center of the inner command signal command_i accords with the falling edge of the inner clock signal clock_i, which latches inner data of the semiconductor device, making the margins of the setup time and hold time identical to each other. As shown in FIG. 2, the center of the clock signal externally applied must be placed between the clock signal and command signal when latch is carried out between clocks. This requires sufficient margin of setup/hold time.

The aforementioned conventional control signal input circuit has the following problems. Though the clock buffer delay and command buffer delay are constructed to be operated identically in the normal condition, the operation margins of them are different from each other, as shown in FIG. 3A, due to a change in characteristics of PMOS transistors and NMOS transistors and temperature variation caused by variation in their fabrication process. This may result in the decrease in margin of one of the setup time tSETUP and hold time tHOLD. FIG. 3A shows that the setup time is in discord with the hold time when the clock buffer delay becomes longer than the command buffer delay due to variation in the characteristics of the transistors.

Meanwhile, when input clock signal clock_pad and input command signal command_pad, externally applied to the semiconductor device, do not have the phase difference of 180° therebetween even though the clock buffer delay and command buffer delay have the same operation margin, as shown in FIG. 3B, the setup/hold times of inner clock signal clock_i and inner command signal command_i become different from each other. FIG. 3B shows that there is disagreement of inner signals clock_i and command_i when the setup time is in discord with the hold time in external signals clock_pad and command_pad, in which tSETUP_pad<tHOLD_pad means the disagreement of the inner signals.

SUMMARY OF THE INVENTION

Accordingly, the present invention is directed to a circuit for controlling the setup/hold time of a semiconductor device that substantially obviates one or more of the problems due to limitations and disadvantages of the related art.

An object of the present invention is to provide a circuit for controlling the setup/hold time of a semiconductor device, which sufficiently secures the margin of the setup/hold time in clock latch operation.

To accomplish the object of the present invention, there is provided a circuit for controlling the setup/hold time of a semiconductor device, including: a setup/hold on signal generator for generating a setup/hold on signal of the semiconductor device; a comparison signal generator for converting the difference between pulse widths of the setup on signal and hold on signal of the setup/hold on signal generator into the voltage difference across an inner capacitor, to generate a comparison signal for the setup/hold time; a comparison signal detector for detecting the comparison signal generated by the comparison signal generator and amplifying it to a predetermined level; a clock delay path selection signal generator for generating a clock delay path selection signal according to the level of the signal detected by the comparison signal detector; and a clock/command signal processor for outputting a clock signal and command signal applied to input pads as an inner clock signal and inner command signal whose delays are compensated according to the clock delay path selection signal.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
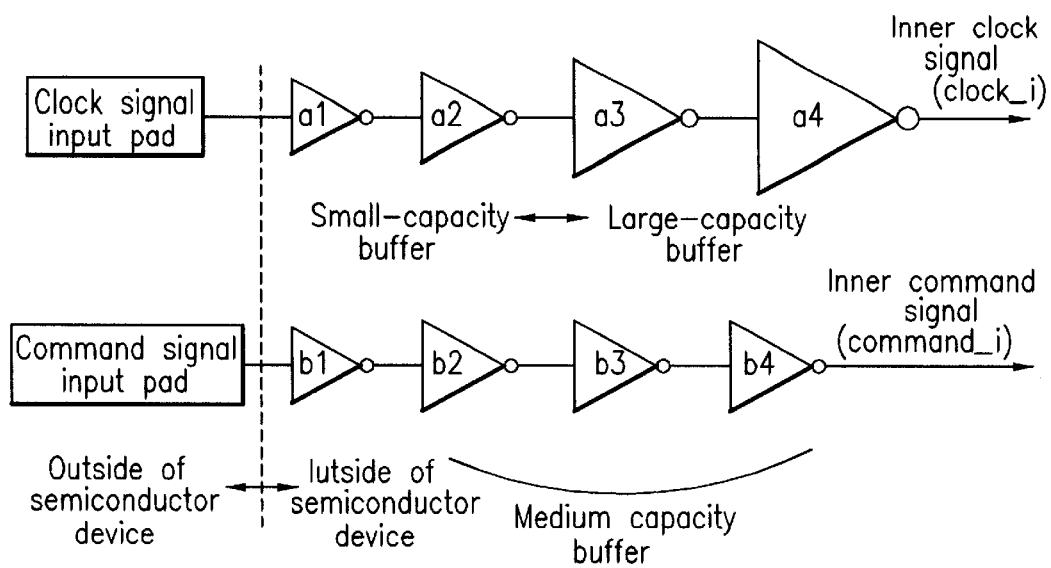
FIG. 1 shows the configuration of a conventional semiconductor device control signal input circuit.
Figure 2:
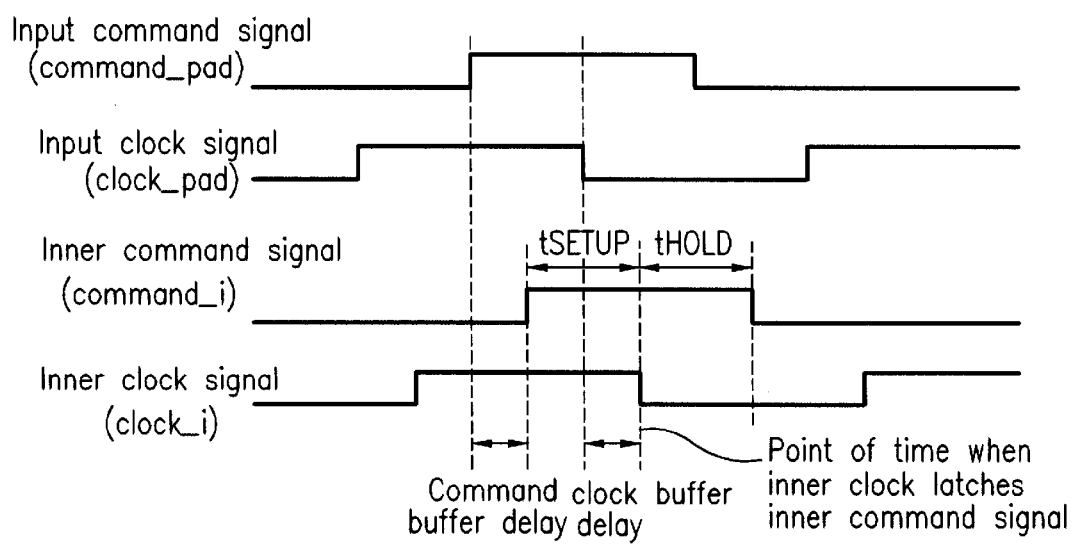
FIG. 2 shows ideal operation waveforms of the conventional control signal input circuit.
Figure 3A:
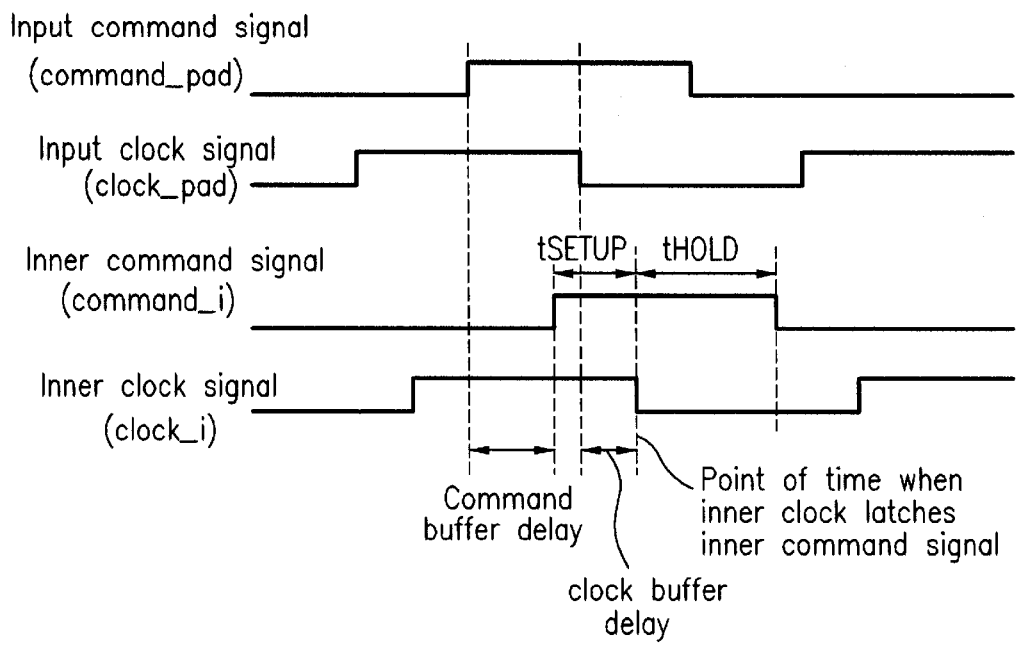
FIGS. 3A and 3B show actual operation waveforms of the conventional control signal input circuit.
Figure 3B:
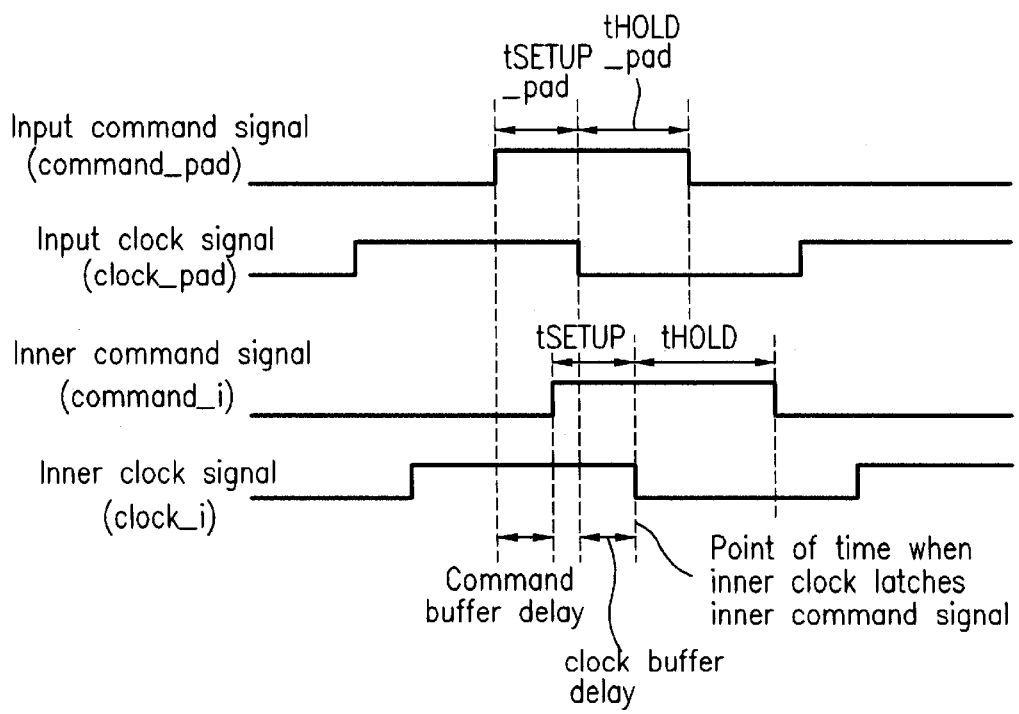
Figure 4A:
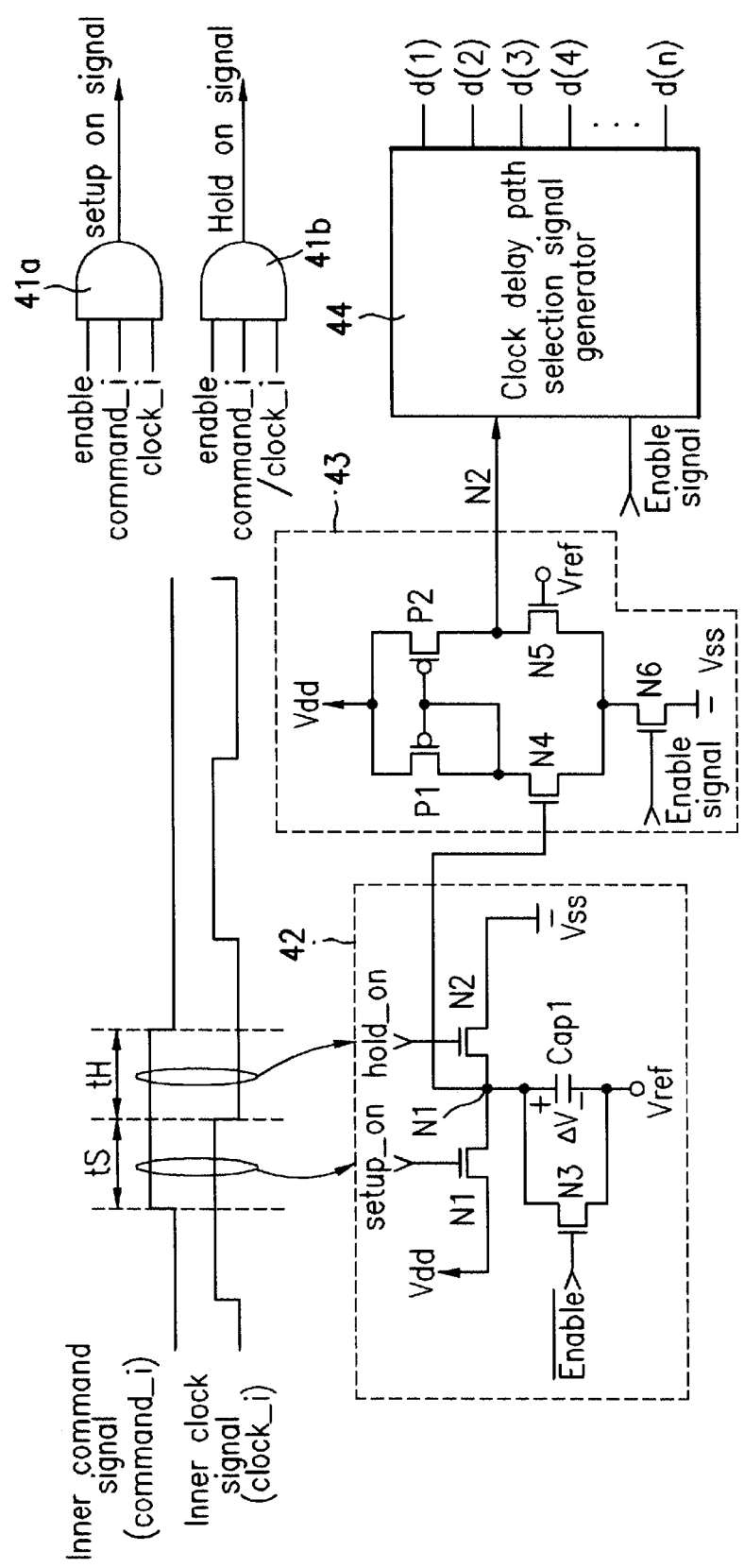
FIG. 4A is a block diagram of a clock delay path selection signal generator and peripheral circuit according to the present invention.
Figure 4B:
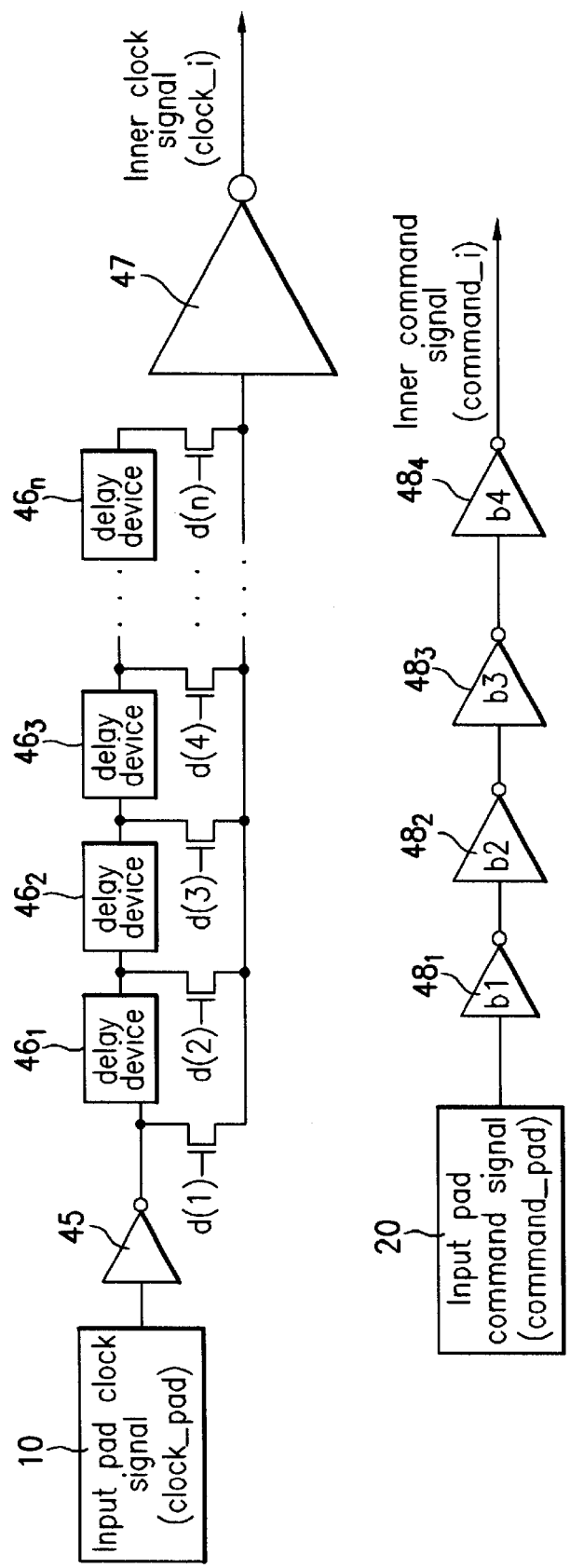
FIG. 4B is a block diagram of a control signal input unit which generates a control signal according to a selection signal of FIG. 4A.
Figure 5A:
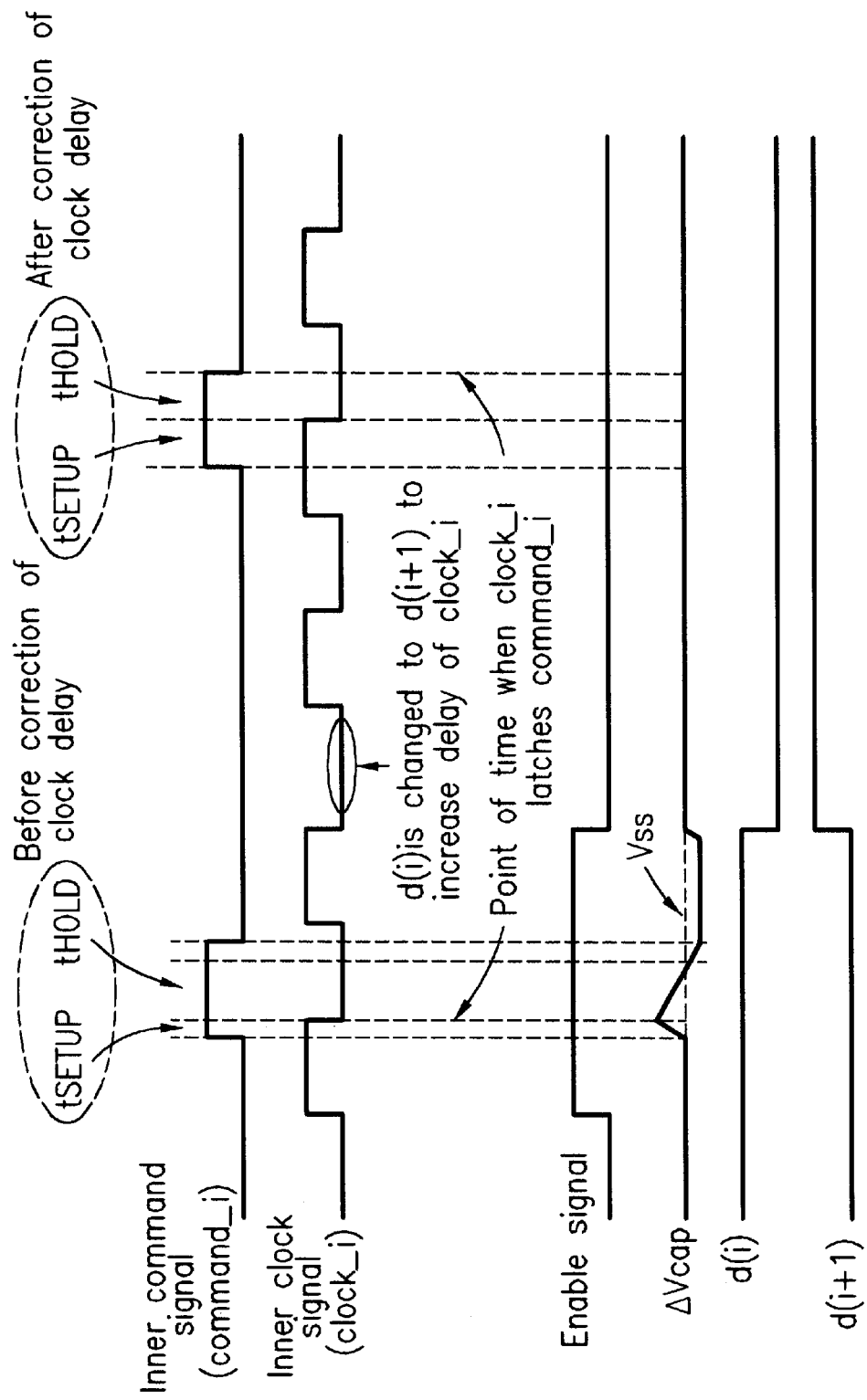
FIGS. 5A and 5B show operation waveforms of a circuit for controlling the setup/hold time of a semiconductor device according to the present invention.
Figure 5B:
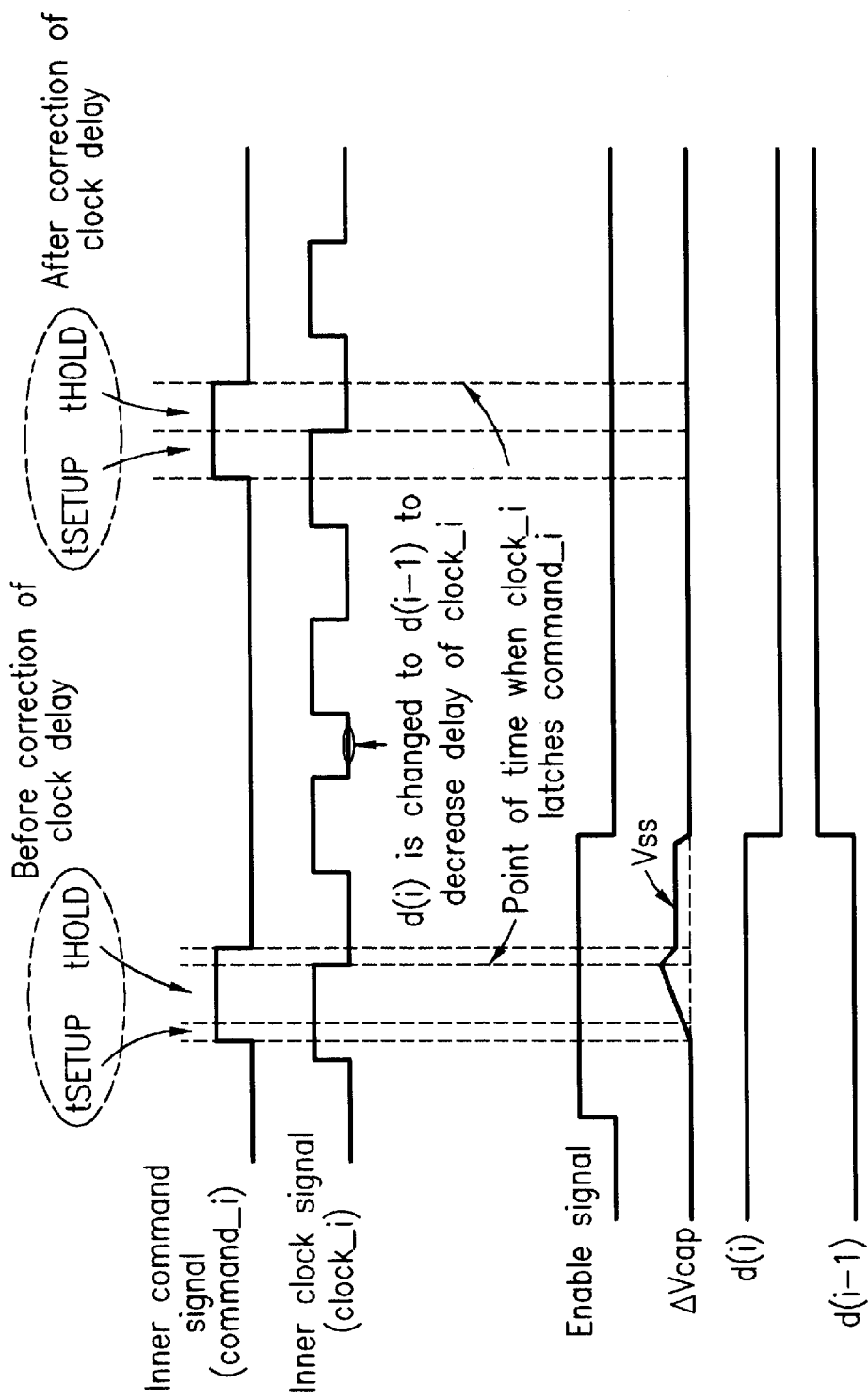

FIG. 4A is a block diagram of a clock delay path selection signal generator and peripheral circuit according to the present invention, FIG. 4B is a block diagram of a control signal input unit which generates a control signal according to a selection signal of FIG. 4A, and FIGS. 5A and 5B show the operation waveforms of a circuit for controlling the setup/hold time of a semiconductor device according to the present invention.

The circuit for controlling the setup/hold time of a semiconductor device according to the present invention includes the clock delay path selection signal generator and control signal input circuit. The control signal input circuit consists of a setup/hold time comparison signal generator and a comparison signal detector.

Referring to FIG. 4A, clock delay path selection signal generator 44 includes a setup on signal generator 41a for logically operating an enable signal, inner command signal command_i and inner clock signal clock_i inside a semiconductor device, to generate a setup on signal in order to selectively vary the delay path of a clock signal external applied into the semiconductor device, and a hold on signal generator 41b for logically operating the enable signal, inner command signal command_i and inner clock signal clock_i to generate a hold on signal. Setup on signal generator 41a and hold on signal generator 41b are configured of a plurality of AND logics which logically operate the enable signal, inner command signal and inner clock signal.

Setup/hold time comparison signal generator 42 consists of first and second NMOS transistors N1 and N2 whose gates receive the setup on signal and hold on signal generated by setup on signal generator 41a and hold on signal generator 41b, respectively, a capacitor Cap1 whose charging voltage varies with the difference between the setup time and hold time, the capacitor being connected to a first node N1 of first and second NMOS transistors N1 and N2, and a third NMOS transistor N3 connected across capacitor Cap1 to supply a reference voltage Vref to first node N1. Comparison signal detector 43 consists of a fourth NMOS transistor N4 whose gate is connected to first node N1 of first and second NMOS transistors N1 and N2, a fifth NMOS transistor N5 whose drain is connected to the input terminal of clock delay path selection signal generator 44, a sixth NMOS transistor N6 whose source is commonly connected to the drains of fourth and fifth NMOS transistors N4 and N5, and first and second PMOS transistors P1 and P2 having their gates and sources commonly connected, the gates being connected to the drain of fourth NMOS transistor N4.

The control signal input circuit includes an input clock processor and input command processor. Referring to FIG. 4B, the input clock processor consists of a first input pad 10 for supplying a clock signal, a first buffer 45 for buffering the input clock signal applied through first input pad 10, n delay devices 46-1, 46-2, 46-3, ..., 46-n serially connected to buffer 45 to sequentially delay the input clock signal, n NMOS transistors, connected to n delay devices 46-1, 46-2, 46-3, ..., 46-n in parallel, which selectively output an nth delayed clock signal according to the clock signal outputted through first buffer 45 or clock delay path selection signal, and a clock driver 47 for finally buffering the delayed clock signal selectively outputted, to output it as inner clock signal clock_i. The command signal processor consists of a second input pad 20 for supplying a command signal, a plurality of buffers 48-1, 48-2, 48-3 and 48-4, serially connected to second input pad 20, which buffer the command signal with their sequentially increasing capacities, to output it as inner command signal command_i.

The circuit for controlling the setup/hold time of a semiconductor device according to the present invention constructed as above generates setup on signal setup_on to turn on first NMOS transistor N1 in order to charge a predetermined level of voltage in capacitor Cap1 for the setup time, and generates hold on signal hold_on to turn on second NMOS transistor N2 in order to discharge the charged voltage for the hold time. Here, because capacitor Cap1 is connected to the sources/drains of first and second NMOS transistors N1 and N2, first and second NMOS transistors N1 and N2 are constructed to have the same size to allow the amount of charge to be identical to the amount of discharge when the setup time is equal to the hold time, if possible, they are configured of NMOS transistors so that variation in semiconductor device fabrication processes cannot affect them.

A high level voltage is applied to second node N2 when tSETUP>tHOLD, and a low level voltage is applied thereto when tSETUP<tHOLD. When second node N2 has the high level output voltage, the clock delay path is reduced through the input clock processor because the clock signal lags behind the command signal. On the contrary, the clock delay path is increased because the clock signal leads the command signal when second node N2 has the low level voltage. At this time, clock delay path selection signal generator 44 applies a delay path selection signal d(1), d(2), d(3), d(4), ..., d(n) to the input clock processor in order to decrease or increase the clock delay path according to the output voltage of second node N2.

When the enable signal for correcting the clock delay is in active state, the voltage of first node N1 is charged in capacitor Cap1 through first NMOS transistor N1 for setup time tSETUP, and the voltage charged in capacitor Cap1 is discharged through second NMOS transistor N2 for hold time tHOLD. The voltage difference ΔV between both terminals of capacitor Cap1 becomes 0V when tSETUP=tHOLD but it becomes a positive or negative level when tSETUP≠tHOLD. This voltage difference is detected by comparison signal detector 43 configured of a differential amplifier, and lead or lag of the clock signal can be known according to the detected signal.

Referring to FIGS. 5A and 5B, on the completion of detection of the clock signal once in a single cycle, clock delay path selection signal generator 44 generates delay path selection signal d(1), d(2), d(3), d(4), . . . , d(n) in which a natural number i is increased or decreased to make d(i) d(i+1) or d(i−1) in order to control the delay of the clock signal. By increasing or decreasing the value of i, the delay of inner clock signal clock_i can be controlled as shown in FIGS. 5A and 5B, and delay can be flexibly applied thereto according to environments of the semiconductor device.

If inner clock signal clock_i leads inner command signal command_i in a predetermined period, delay path selection signal is changed from d(i) to d(i+1) to increase the delay of inner clock signal clock_i. Accordingly, inner command signal command_i is latched by inner clock signal clock_i, as shown in FIG. 5A. On the contrary, if inner clock signal clock_i lags behind inner command signal command_i in a predetermined period, delay path selection signal is changed from d(i) to d(i−1) to decrease the delay of inner clock signal clock_i. Accordingly, inner command signal command_i is latched by inner clock signal clock_i, as shown in FIG. 5B. Here, inner command signal command_i is obtained by buffering command signal command_pad applied through command signal input pad 20 with plurality of buffers 48-1, 48-2, 48-3 and 48-4.

The circuit for controlling the setup/hold time of a semiconductor device according to the present invention has the following advantages. First of all, the inner clock signal and inner command signal compensate the delay of inner clock signal, which is caused by variation in characteristics of semiconductor device according to its fabrication process and variation in the relation between signals externally applied to the input pad, to sufficiently secure the margin of setup/hold time. Furthermore, the present invention can satisfactorily secure the margin of setup/hold time in the latching operation of the inner clock signal and inner command signal.

It will be apparent to those skilled in the art that various modifications and variations can be made in the circuit for controlling the setup/hold time of a semiconductor device of the present invention without departing from the spirit or scope of the invention. Thus, it is intended that the present invention cover the modifications and variations of this invention provided they come within the scope of the appended claims and their equivalents.

What is claimed is:

1. A circuit for controlling the setup/hold time of a semiconductor device, comprising:

a setup/hold on signal generator for generating a setup/hold on signal of the semiconductor device;

a comparison signal generator for converting the difference between pulse widths of the setup on signal and hold on signal of the setup/hold on signal generator into the voltage difference across an inner capacitor, to generate a comparison signal for the setup/hold time;

a comparison signal detector for detecting the comparison signal generated by the comparison signal generator and amplifying it to a predetermined level;

a clock delay path selection signal generator for generating a clock delay path selection signal according to the level of the signal detected by the comparison signal detector; and a clock/command signal processor for outputting a clock signal and command signal applied to input pads as an inner clock signal and inner command signal whose delays are compensated according to the clock delay path selection signal.

2. The circuit as claimed in claim 1, wherein the clock signal processor includes a first input pad for supplying the clock signal, a first buffer for buffering the input clock signal applied through the first input pad, n delay devices serially connected to the buffer to sequentially delay the input clock signal, n NMOS transistors which are connected to the n delay devices and selectively output an nth delayed clock signal according to the clock signal outputted through the first buffer or clock delay path selection signal, and a clock driver for finally buffering the delayed clock signal selectively outputted to output it as the inner clock signal.

3. The circuit as claimed in claim 1, wherein the command signal processor includes a first input pad, and a plurality of buffers serially connected to the first input pad to buffer the command signal with their sequentially increasing capacities, outputting it as the inner command signal.

4. The circuit as claimed in claim 1, wherein the setup on signal generator is configured of a first AND gate which logically operates an enable signal, the inner command signal and inner clock signal inside of the semiconductor device.

5. The circuit as claimed in claim 1, wherein the hold on signal generator is configured of a second AND gate which logically operates the enable signal, inner command signal and inner clock signal.

6. The circuit as claimed in claim 1, wherein the comparison signal generator includes first and second NMOS transistos whose gates receive the setup on signal and hold on signal, respectively, a capacitor whose charging voltage varies with the difference between the setup time and hold time, the capacitor being connected to a first node of the first and second NMOS transistors, and a third NMOS transistor connected across the capacitor to supply a reference voltage to the first node.

7. The circuit as claimed in claim 6, wherein a voltage having a predetermined level is charged in the capacitor for the setup time when the first NMOS transistor is turned on according to the setup on signal, and the voltage charged in the capacitor is discharged when the second NMOS transistor is turned on according to the hold on signal.

8. The circuit as claimed in claim 1, wherein the comparison signal detector outputs a high level signal for decreasing the clock delay path when tSETUP>tHOLD and outputs a low level signal for increasing the clock delay path when tSETUP<tHOLD.

9. The circuit as claimed in claim 1, wherein the comparison signal detector includes a fourth NMOS transistor whose gate is connected to the first node of the first and second NMOS transistors, a fifth NMOS transistor whose drain is connected to a second node, a sixth NMOS transistor whose source is commonly connected to the drains of the fourth and fifth NMOS transistors, and first and second PMOS transistors having their gates and sources commonly connected, the gates being connected to the drain of the fourth NMOS transistor.

10. The circuit as claimed in claim 9, wherein the comparison signal detector outputs a high level signal for decreasing the clock delay path when tSETUP>tHOLD and outputs a low level signal for increasing the clock delay path when tSETUP<tHOLD.

11. The circuit as claimed in claim 9, wherein the drain of the first PMOS transistor is connected to the drain of the fourth NMOS transistor, and the drains of the second PMOS transistor and fifth NMOS transistor are commonly connected to the second node.

12. The circuit as claimed in claim 11, wherein the second node is the input terminal of the clock delay path selection signal generator.

* * * * *